(12) United States Patent
He et al.

(10) Patent No.: US 11,335,709 B2
(45) Date of Patent: May 17, 2022

(54) ARRAY SUBSTRATE, DISPLAY PANEL, DISPLAY DEVICE AND METHOD FOR FORMING ARRAY SUBSTRATE

(71) Applicant: Xiamen Tianma Micro-Electronics Co., Ltd., Xiamen (CN)

(72) Inventors: Shui He, Xiamen (CN); Shanshan Zheng, Shanghai (CN); Yaqi Kuang, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 16/916,023

(22) Filed: Jun. 29, 2020

(65) Prior Publication Data
US 2021/0305284 A1 Sep. 30, 2021

(30) Foreign Application Priority Data
Mar. 30, 2020 (CN) .......................... 202010236566.X

(51) Int. Cl.
*H01L 27/00* (2006.01)
*H01L 29/00* (2006.01)
(Continued)

(52) U.S. Cl.
CPC ...... *H01L 27/1225* (2013.01); *H01L 27/1251* (2013.01); *H01L 27/1255* (2013.01); *H01L 27/1259* (2013.01); *H01L 29/24* (2013.01); *H01L 29/66757* (2013.01); *H01L 29/66969* (2013.01); *H01L 29/7869* (2013.01);
(Continued)

(58) Field of Classification Search
CPC ............. H01L 27/1225; H01L 27/1251; H01L 27/1255; H01L 27/1259; H01L 27/3262; H01L 29/24; H01L 29/66757; H01L 29/66969; H01L 29/78633; H01L 29/78648; H01L 29/78675; H01L 29/7869;
(Continued)

(56) References Cited

U.S. PATENT DOCUMENTS 9,412,876 B2 * 8/2016 Koezuka ........... H01L 29/78693
9,911,762 B2 * 3/2018 Yan ................... H01L 29/78648
(Continued)

FOREIGN PATENT DOCUMENTS

| CN | 104299977 A | 1/2015 |
|---|---|---|
| CN | 206584934 U | 10/2017 |
| CN | 108231795 A | 6/2018 |

*Primary Examiner* — Nikolay K Yushin
(74) *Attorney, Agent, or Firm* — Anova Law Group, PLLC

(57) ABSTRACT

Array substrate, display panel, display device, and method for forming array substrate are provided. The array substrate includes a substrate and at least one first thin-film transistor on the substrate. the first thin-film transistor includes a first gate electrode; a first gate electrode insulating layer on a side of the first gate electrode facing away from the substrate; a first active layer on a side of the first gate electrode insulating layer facing away from the first gate electrode; a second gate electrode insulating layer on a side of the first active layer facing away from the first gate electrode insulating layer; a second gate electrode on a side of the second gate electrode insulating layer facing away from the first active layer; and a first source electrode and a first drain electrode on the first active layer facing away from the first gate electrode insulating layer.

16 Claims, 11 Drawing Sheets

(51) Int. Cl.
*H01L 27/12* (2006.01)
*H01L 29/24* (2006.01)
*H01L 29/66* (2006.01)
*H01L 29/786* (2006.01)
*H01L 27/32* (2006.01)

(52) U.S. Cl.
CPC .. *H01L 29/78633* (2013.01); *H01L 29/78648* (2013.01); *H01L 29/78675* (2013.01); *H01L 29/78696* (2013.01); *H01L 27/3262* (2013.01)

(58) Field of Classification Search
CPC ........... H01L 29/78696; H01L 27/3258; H01L 27/3244
See application file for complete search history.

(56) References Cited

U.S. PATENT DOCUMENTS

| | | |
|---|---|---|
| 10,777,686 B2 * | 9/2020 | Wang ................ H01L 29/42384 |
| 2009/0233390 A1 | 9/2009 | Yamazaki et al. |
| 2015/0228803 A1 * | 8/2015 | Koezuka ........... H01L 29/78693 257/43 |
| 2017/0062541 A1 | 3/2017 | Ishiyama et al. |
| 2017/0075155 A1 * | 3/2017 | Oikawa ............. H01L 29/78648 |
| 2017/0162606 A1 * | 6/2017 | Yan ................... H01L 29/78648 |
| 2019/0305134 A1 * | 10/2019 | Wang ................ H01L 29/66742 |

* cited by examiner

ARRAY SUBSTRATE, DISPLAY PANEL, DISPLAY DEVICE AND METHOD FOR FORMING ARRAY SUBSTRATE

CROSS-REFERENCES TO RELATED APPLICATIONS

This application claims priority of Chinese Patent Application No. 202010236566.X, filed on Mar. 30, 2020, the entire contents of which are hereby incorporated by reference.

FIELD OF THE DISCLOSURE

The present disclosure generally relates to the field of display technology and, more particularly, relates to an array substrate, a display panel, a display device, and a method for forming the array substrate.

BACKGROUND

An array substrate of a liquid crystal display device or an organic light emitting diode display device is provided with a plurality of pixel circuits disposed in an array. Each pixel circuit includes a plurality of thin-film transistors. Existing thin-film transistors mainly include amorphous silicon thin-film transistors, low temperature polysilicon thin-film transistors and metal oxide thin-film transistors, etc. However, existing thin-film transistors have defects, such as low mobility, large leakage current and so on, which make the thin-film transistors unable to provide stable and uniform current or voltage when driving the light-emitting structure or liquid crystal, thereby affecting display effect of a display device.

In recent years, more attention is focused on double-gate thin-film transistors, in which pixel circuits are used to realize functions for improving mobility and reducing leakage current. However, existing double-gate thin-film transistors have short circuit or open circuit problems between film layers during a forming process, which affects normal operation of the double-gate thin-film transistors, thereby affecting display effect of the formed display device.

BRIEF SUMMARY OF THE DISCLOSURE

One aspect of the present disclosure provides an array substrate. The array substrate includes a substrate and at least one first thin-film transistor on the substrate. A first thin-film transistor of the at least one first thin-film transistor includes a first gate electrode; a first gate electrode insulating layer on a side of the first gate electrode facing away from the substrate; a first active layer on a side of the first gate electrode insulating layer facing away from the first gate electrode; a second gate electrode insulating layer on a side of the first active layer facing away from the first gate electrode insulating layer; a second gate electrode on a side of the second gate electrode insulating layer facing away from the first active layer; and a first source electrode and a first drain electrode on the first active layer facing away from the first gate electrode insulating layer. The first active layer includes a first region and a second region surrounding the first region. A vertical projection of the first gate electrode on the substrate is within a vertical projection of the first region on the substrate. The vertical projection of the first region on the substrate is within a vertical projection of the second gate electrode insulating layer on the substrate. The vertical projection of the second gate electrode insulating layer on the substrate is within a vertical projection of the first active layer on the substrate.

Another aspect of the present disclosure provides a display panel. The display panel includes an array substrate. The array substrate includes a substrate and at least one first thin-film transistor on the substrate. A first thin-film transistor of the at least one first thin-film transistor includes a first gate electrode; a first gate electrode insulating layer on a side of the first gate electrode facing away from the substrate; a first active layer on a side of the first gate electrode insulating layer facing away from the first gate electrode; a second gate electrode insulating layer on a side of the first active layer facing away from the first gate electrode insulating layer; a second gate electrode on a side of the second gate electrode insulating layer facing away from the first active layer; and a first source electrode and a first drain electrode on the first active layer facing away from the first gate electrode insulating layer. The first active layer includes a first region and a second region surrounding the first region. A vertical projection of the first gate electrode on the substrate is within a vertical projection of the first region on the substrate. The vertical projection of the first region on the substrate is within a vertical projection of the second gate electrode insulating layer on the substrate. The vertical projection of the second gate electrode insulating layer on the substrate is within a vertical projection of the first active layer on the substrate.

Another aspect of the present disclosure provides a display device. The display device includes the display panel described above.

Another aspect of the present disclosure provides a method for forming an array substrate. The array substrate includes at least one first thin-film transistor. A first thin-film transistor of the at least one first thin-film transistor includes a first gate electrode, a first gate electrode insulating layer, a first active layer, a second gate electrode insulating layer, a first source electrode, a first drain electrode, and a second gate electrode. The method includes: providing a substrate; forming a first gate electrode on the substrate; forming a first gate electrode insulating layer on a side of the first gate electrode facing away from the substrate; forming a first active layer on a side of the first gate electrode insulating layer facing away from the first gate electrode; forming a second gate electrode insulating layer on a side of the first active layer facing away from the first gate electrode insulating layer; forming a second gate electrode on a side of the second gate electrode insulating layer facing away from the first active layer, and forming a first source electrode and a first drain electrode on the first active layer facing away from the first gate electrode insulating layer. The first active layer includes a first region and a second region surrounding the first region. A vertical projection of the first gate electrode on the substrate is within a vertical projection of the first region on the substrate. The vertical projection of the first region on the substrate is within a vertical projection of the second gate electrode insulating layer on the substrate. The vertical projection of the second gate electrode insulating layer on the substrate is within a vertical projection of the first active layer on the substrate.

Other aspects or embodiments of the present disclosure can be understood by those skilled in the art in light of the description, the claims, and the drawings of the present disclosure.

DETAILED DESCRIPTION

In order to make the objectives, technical solutions and advantages of the present disclosure clear, technical solutions of the present disclosure are fully described in the following through specific implementation manners with reference to accompanying drawings. Obviously, the described embodiments are part but not all of the embodiments of the present disclosure. Based on the embodiments of the present disclosure, all other embodiments obtained by those skilled in the art without making creative efforts fall within the protection scope of the present disclosure.

Figure 1:
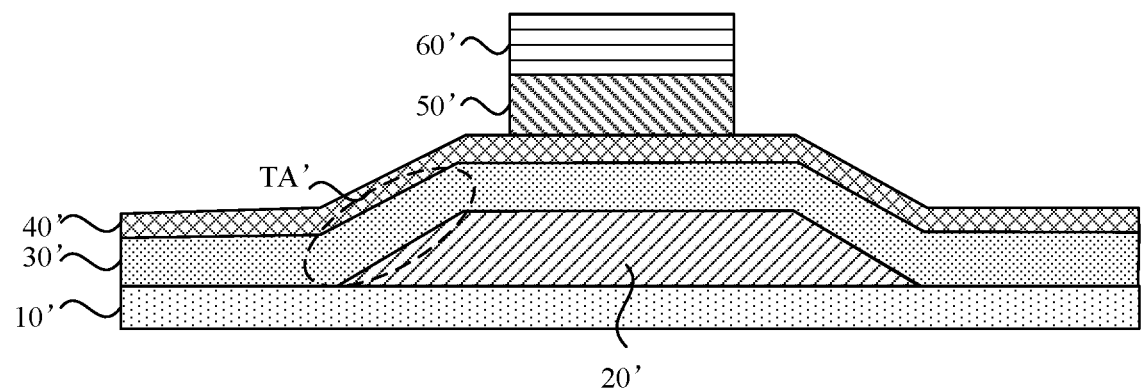
FIG. 1 illustrates a schematic diagram of an array substrate.

FIG. 1 illustrates a schematic diagram of an array substrate. As shown in FIG. 1, the array substrate includes a substrate 10', a first gate electrode 20' on a side of the substrate 10', a first gate electrode insulating layer 30' on a side of the first gate electrode 20' facing away from the substrate 10', a first active layer 40' on a side of the first gate electrode insulating layer 30' facing away from the substrate 10', a second gate electrode insulating layer 50' on a side of the first active layer 40' facing away from the substrate 10', and a second gate electrode 60' on a side of the second gate electrode insulating layer 50' facing away from the substrate 10'. Since a vertical projection of the first gate electrode 20' on a plane perpendicular to the substrate 10' is rectangular or trapezoidal, there will be a slope at an edge of first gate electrode 20'. When the first gate electrode insulating layer 30' is formed, a slope TA' may also be formed in a region corresponding to the edge of the first gate electrode 20'. Therefore, when a film is formed on the first active layer 40', the film is thin and loose at the slope TA'. When the second gate electrode insulating layer 50' is formed by etching, the first active layer 40' corresponding to the slope TA' is easily broken.

It is found that a thickness of the first active layer 40' can be increased to avoid a problem that the first active layer 40' corresponding to the position of the slope TA' is easily broken when the second gate electrode insulating layer 50' is formed by etching. However, since the first active layer 40' serves as an active layer of the thin-film transistor, an increase in film thickness may affect properties of the thin-film transistor, resulting in poor stability.

A technical solution to the above technical problem is provided in the present disclosure. Specifically, an array substrate including a substrate and at least one first thin-film transistor on the substrate is provided in one embodiment. The first thin-film transistor includes a first gate electrode; a first gate electrode insulating layer on a side of the first gate electrode facing away from the substrate; a first active layer on a side of the first gate electrode insulating layer facing away from the first gate electrode; a second gate electrode insulating layer on a side of the first active layer facing away from the first gate electrode insulating layer; a second gate electrode on a side of the second gate electrode insulating layer facing away from the first active layer; and a first source electrode and a first drain electrode on the first active layer facing away from the first gate electrode insulating layer. The first active layer includes a first region and a second region surrounding the first region. A vertical projection of the first gate electrode on the substrate is within a vertical projection of the first region on the substrate. The vertical projection of the first region on the substrate is within a vertical projection of the second gate electrode insulating layer on the substrate. The vertical projection of the second gate electrode insulating layer on the substrate is within a vertical projection of the first active layer on the substrate. By using the above technical solution, a vertical projection of the first gate electrode on the substrate is within a vertical projection of the first region of the first active layer on the substrate. The vertical projection of the first region of the first active layer on the substrate is within a vertical projection of the second gate electrode insulating layer on the substrate. That is, a slope region of the first active layer corresponding to an edge of first gate electrode is covered by the second gate electrode insulating layer, and the slope region of the first active layer is protected by the second gate electrode insulating layer. Therefore, when a film is formed on the first active layer, the film at a position of the slope can be prevented from being thin and loose, and when the second active layer is etched on a side of the first active layer facing away from the substrate, a problem that the slope region of the first active layer corresponding to the edge of the first gate electrode is easily broken can be prevented.

More details are provided herein according to various embodiments of the present disclosure with reference to the accompanying drawings. Based on the embodiments of the present disclosure, all other embodiments obtained by those skilled in the art without creative efforts shall fall within the protection scope of the present disclosure.

Figure 2:
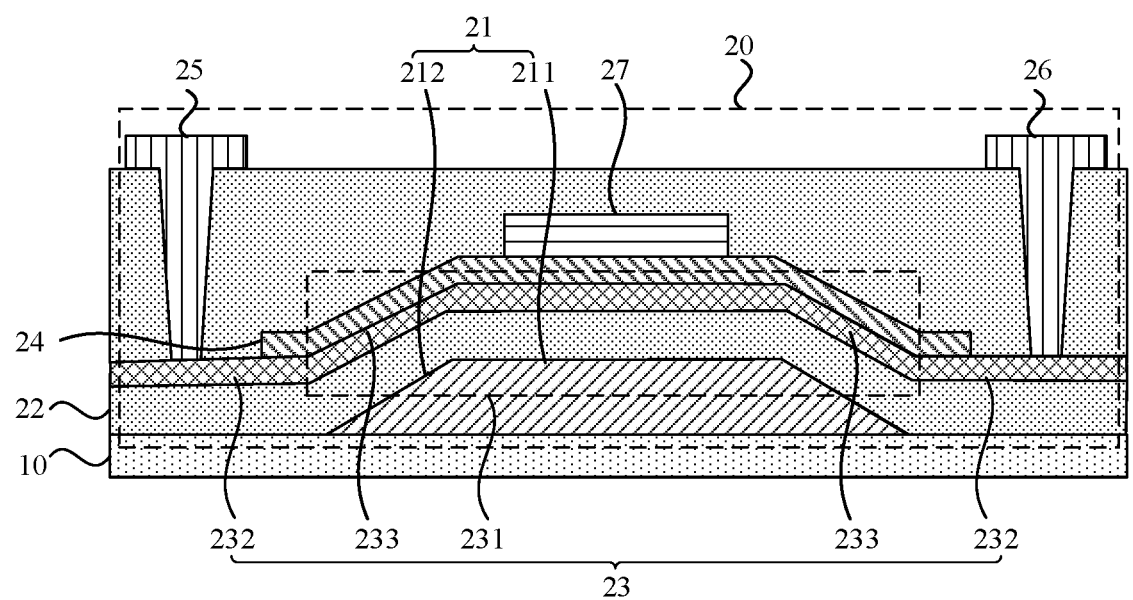
FIG. 2 illustrates a schematic diagram of an array substrate consistent with various disclosed embodiments of the present disclosure.

FIG. 2 illustrates a schematic diagram of an array substrate consistent with various disclosed embodiments of the present disclosure. As shown in FIG. 2, the array substrate includes a substrate 10 and at least one first thin-film transistor 20 on the substrate 10. The first thin-film transistor 20 includes: a first gate electrode 21; a first gate electrode insulating layer 22 on a side of the first gate electrode 21 facing away from the substrate 10; a first active layer 23 on a side of the first gate electrode insulating layer 22 facing away from the first gate electrode 21; a second gate electrode insulating layer 24 on a side of the first active layer 23 facing away from the first gate electrode insulating layer 22; a first source electrode 25 and a first drain electrode 26 on a side of the first active layer 23 faces away from a surface of the first gate electrode insulating layer 22; and a second gate electrode 27 on a side of the second gate electrode insulating layer 24 facing away from the first active layer 23. The first active layer 23 includes a first region 231 and a second region 232 surrounding the first region 231. A vertical projection of the first grid 21 on the substrate 10 is within a vertical projection of the first region 231 on the substrate 10. The vertical projection of the first region 231 on the substrate 10 is within a vertical projection of the second gate electrode insulating layer 24 on the substrate 10. The vertical projection of the second gate electrode insulating layer 24 on the substrate 10 is within a vertical projection of the first active layer 23 on the substrate 10.

As shown in FIG. 2, since the first active layer 23 is a semiconductor, regions other than channel regions of the first active layer 23 need to be subjected to electrical conductivity treatment, so that the first source electrode 25 and the first drain electrode 26 are electrically connected to the first active layer 23. In one embodiment, a vertical projection of the second gate electrode insulating layer 24 on the substrate 10 is within a vertical projection of the first active layer 23 on the substrate 10, which facilitates an electrical conduction of the first active layer 23. At a same time, the first source electrode 25 and the first drain electrode 26 are in sufficient contact with the first active layer 23 to reduce a contact resistance between the first source electrode 25 and the first drain electrode 26. Since the first gate electrode 21 includes a straight portion 211 and a slope portion 212, a slope may be formed in a region corresponding to the slope portion 212 of the first gate electrode 22 when the first gate electrode insulating layer 22 is formed. When a film is formed on the first active layer 23, the film is thin and loose at a position 2311 corresponding to the slope portion 212 of the first gate electrode 22. A vertical projection of the first region 231 of the first active layer 23 on the substrate 10 is within a vertical projection of the second gate electrode insulating layer 24 on the substrate 10. That is, the slope position 2311 of the first active layer 23 is covered by the second gate electrode insulating layer 24, thereby avoiding a problem that the slope position 2311 of the first active layer 23 is easily broken when the second gate electrode insulating layer 24 is formed by etching, and improving reliability of the first thin-film transistor 20.

Figure 3:
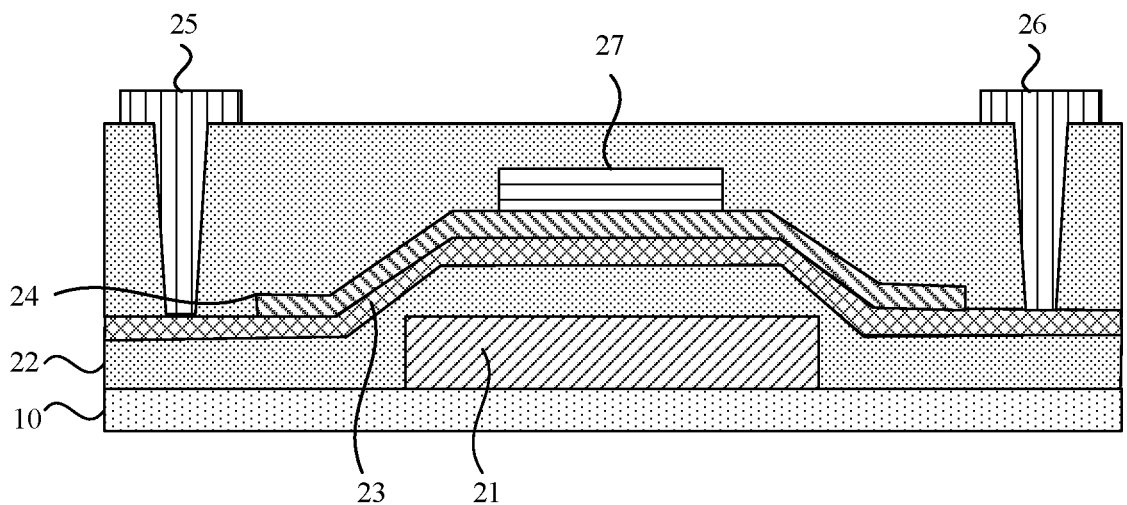
FIG. 3 illustrates a schematic diagram of another array substrate consistent with various disclosed embodiments of the present disclosure.

When the first gate electrode 21 is formed, a vertical projection of the first gate electrode 21 perpendicular to a plane of the substrate 10 is rectangular or trapezoidal. FIG. 2 only exemplarily illustrates that a vertical projection of the first gate electrode 21 on a plane perpendicular to the substrate 10 is trapezoidal. In other embodiments, a vertical projection of the first gate electrode 21 on a plane perpendicular to the substrate 10 may also be rectangular. FIG. 3 illustrates a schematic diagram of another array substrate consistent with various disclosed embodiments of the present disclosure. When a vertical projection of the first gate electrode 21 on a plane perpendicular to the substrate 10 is rectangular, a slope region of the first active layer 23 corresponding to a first gate electrode 21 is covered by the second gate electrode insulating layer 24.

Optionally, referring to FIG. 2, a vertical projection of the second gate electrode 27 on the substrate 10 is within a vertical projection of the first gate electrode 21 on the substrate 10.

When a material of the substrate 10 is an organic material or silicon nitride, certain ions in the organic material or silicon nitride such as hydrogen ions, or an electric field generated by electric charges between film layer interfaces on a side of the first gate electrode 21 close to the substrate 10, may affect channel regions of the first active layer 23. In one embodiment, the first gate electrode 21 blocks the certain ions in the substrate 10 or the electric field generated by the electric charges between the film layer interfaces on the side of the first electrode 21 close to the substrate 10, to prevent the certain ions in the substrate 10 or the electric field generated by the electric charge between the film layer interfaces from affecting the channel regions of the first active layer 23, thereby improving reliability of the first thin-film transistor 20.

Figure 4:
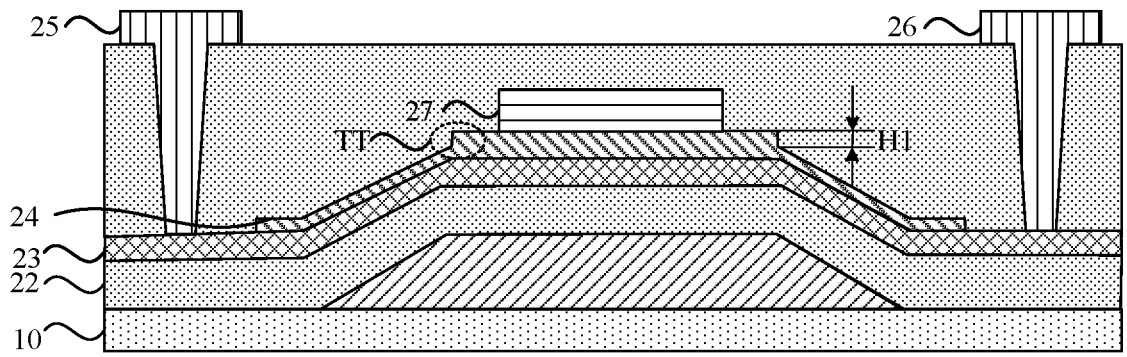
FIG. 4 illustrates a schematic diagram of another array substrate consistent with various disclosed embodiments of the present disclosure.

Optionally, FIG. 4 illustrates a schematic diagram of another array substrate consistent with various disclosed embodiments of the present disclosure. As shown in FIG. 4, the second gate electrode insulating layer 24 includes a stepped region TT. A vertical projection of the stepped region TT on a plane of the substrate 10 does not overlap with a vertical projection of the second gate electrode 27 on a plane of the substrate 10.

In one embodiment, by forming the stepped region TT in the second gate electrode insulating layer 24, on one hand, in a process of etching to form the stepped region TT, regions of the first active layer 23 other than the channel regions can be subjected to a conductive treatment. For example, when the first active layer 23 is an indium gallium zinc oxide semiconductor active layer, in the process of etching to form the step region TT 23, the first active layer corresponding to the thinned second gate electrode insulating layer 24 becomes conductive by plasma bombardment. On the other hand, the subsequent film layer formed on the second gate electrode 27 have better coverage.

Optionally, referring to FIG. 4, in a direction perpendicular to the substrate 10, a thickness of the step region TT is H1, where 500 nm<H1<700 nm.

In one embodiment, a thickness of the step region TT is set to be between 500 nm and 700 nm. A conductive treatment of the first active layer 23 corresponding to the step region TT may not be affected because the step region TT is too thick. The first active layer 23 may not be damaged in a process of etching the second gate electrode insulating layer 24 to form the step region TT because the step region TT is too thin. Therefore, a thickness of the step region TT is preferably set to 500 nm<H1<700 nm, to ensure that the first active layer 23 corresponding to the step region TT is electrically conductive, and fully protect the first active layer 23 to avoid damaging the first active layer 23 and then affecting performance of the first thin-film transistor 20.

Figure 5:
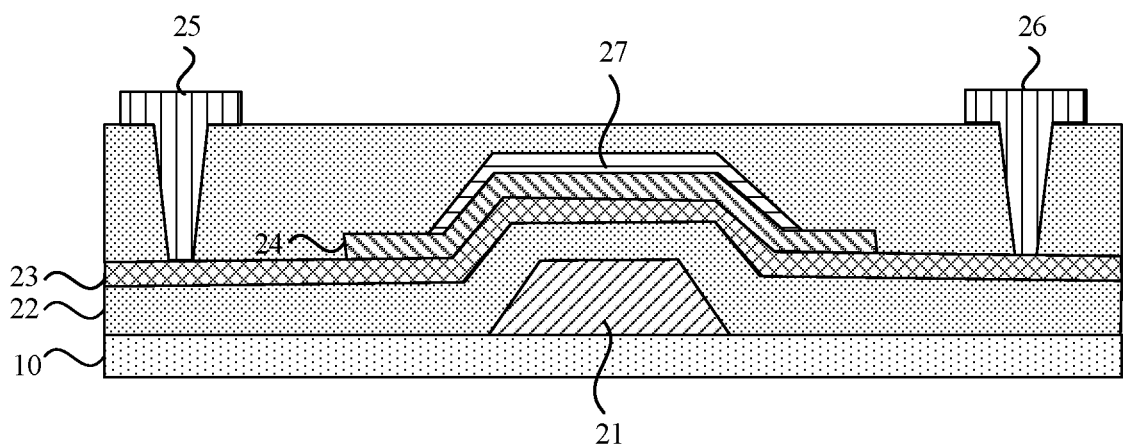
FIG. 5 illustrates a schematic diagram of another array substrate consistent with various disclosed embodiments of the present disclosure.

Optionally, FIG. 5 illustrates a schematic diagram of another array substrate consistent with various disclosed embodiments of the present disclosure. As shown in FIG. 5, a vertical projection of the first gate electrode 21 on the substrate 10 is within a vertical projection of the second gate electrode 27 on the substrate 10.

In one embodiment, some ions such as hydrogen ions in film layers above a side of the second gate electrode 27 facing away from the substrate 10 are blocked by the second gate electrode 27, to prevent the hydrogen ions from diffusing into channel regions of the first active layer 23 and causing performance degradation of the first thin-film transistor 20, thereby improving reliability of the first thin-film transistor 20. Further, a vertical projection of the first gate electrode 21 on the substrate 10 is within a vertical projection of the second gate electrode 27 on the substrate 10, that is, a thin position of the first active layer 23 due to a slope of the first gate electrode 21 is below the second gate electrode 27. Therefore, when the second gate electrode insulating layer 24 is formed by etching, the thin position of the first active layer 23 is not over-etched, further improving reliability of the first thin-film transistor 20.

When a vertical projection of the first grid 21 on the substrate 10 is within a vertical projection of the second grid 27 on the substrate 10, only hydrogen ions in the film layer above a side of the second gate electrode 27 facing away from the substrate 10 are blocked. However, the hydrogen ions in the substrate 10 or an electric field generated by electronic charges between film layer interfaces on a side of the first gate electrode 21 close to the substrate 10 affect channel regions of the first active layer 23, thereby affecting reliability of the first thin-film transistor 20.

Figure 6:
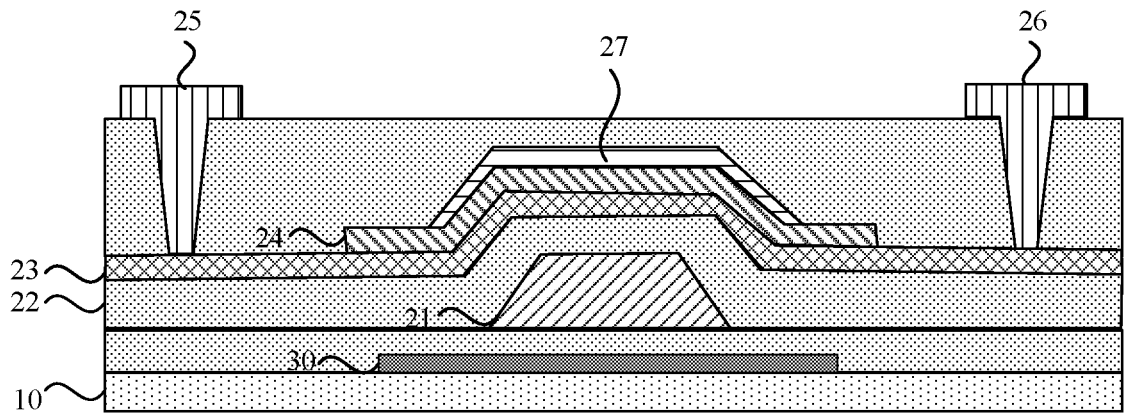
FIG. 6 illustrates a schematic diagram of another array substrate consistent with various disclosed embodiments of the present disclosure.

Optionally, FIG. 6 illustrates a schematic diagram of another array substrate consistent with various disclosed embodiments of the present disclosure. As shown in FIG. 6, the first thin-film transistor 20 further includes: a shielding layer 30; the shielding layer 30 being on a side of the first gate electrode 21 facing away from the first gate electrode insulating layer 22; a vertical projection of the second gate electrode 27 on the substrate 10 being on the shielding layer 30 within a vertical projection on the substrate 10.

In one embodiment, a shield layer 30 is provided on a side of the first gate electrode 21 facing away from the first gate electrode insulating layer 22. The shielding layer 30 blocks hydrogen ions in the substrate 10 or an electric field generated by electric charges between the film layer interfaces of the first gate electrode 21 close to the substrate 10, so as to prevent the hydrogen ions in the substrate 10 or the electric field generated by the electric charge between the film layer interfaces from affecting channel regions of the first active layer 23, thereby improving reliability of the first thin-film transistor 20.

Optionally, a material of the first active layer 23 includes an indium gallium zinc oxide material.

Figure 7:
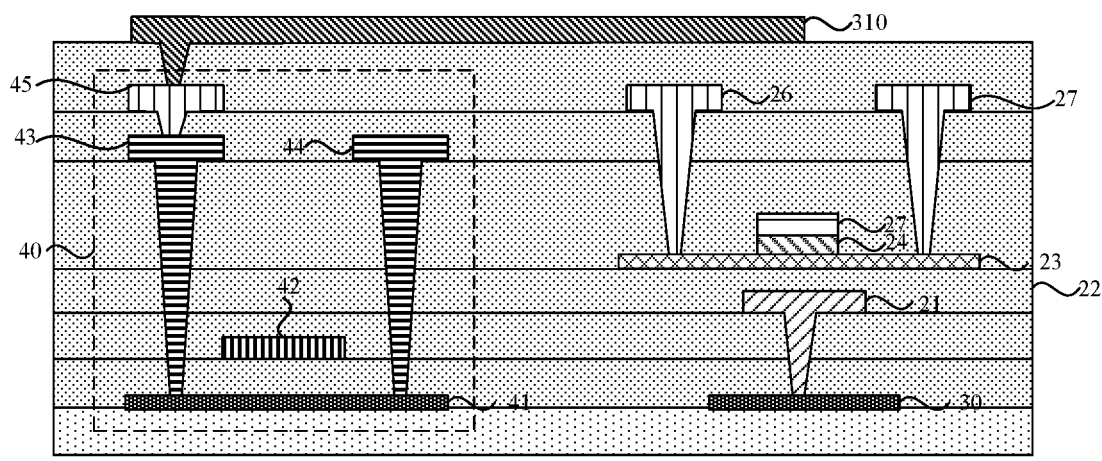
FIG. 7 illustrates a schematic diagram of another array substrate consistent with various disclosed embodiments of the present disclosure.

When the first active layer 23 of the first thin-film transistor 20 is an indium gallium zinc oxide semiconductor active layer, the first thin-film transistor 20 has advantages of high carrier mobility, low deposition temperature, high transparency and so on, thereby realizing low frequency driving Optionally, FIG. 7 illustrates a schematic diagram of another array substrate consistent with various disclosed embodiments of the present disclosure. As shown in FIG. 7, the array substrate further includes at least one second thin-film transistor 40. The second thin-film transistor 40 includes a second active layer 41. The second active layer 41 is on a side of the first gate electrode 21 facing away from the first gate electrode insulating layer 22. A material of the second active layer 41 includes low-temperature polysilicon material.

Low temperature polysilicon thin-film transistors have advantages of high switching speed and low power consumption. Oxide semiconductor thin-film transistors have advantages of high carrier mobility, low deposition temperature and high transparency. In one embodiment, the first thin-film transistor 20 and the second thin-film transistor 40 are provided on the substrate 10. The first thin-film transistor 20 includes an indium gallium zinc oxide semiconductor active layer. The second thin-film transistor 40 includes a low temperature polysilicon active layer. Advantages of the two kinds of thin-film transistors can be fully utilized to ensure that a display device has good display performance.

Optionally, referring to FIG. 7, the first thin-film transistor 20 further includes a shielding layer 30. The shielding layer 30 is on a side of the first gate electrode 21 facing away from the first gate electrode insulating layer 22. The second active layer 41 and the shielding layer 30 is made of a same material and by a same process. The shielding layer 30 is electrically connected to the first gate electrode 21.

In one embodiment, the shielding layer 30 blocks impurities in the substrate 10 or an electric field generated by electric charges between the film layer interfaces on a side of the first gate electrode 21 close to the substrate 10, so as to prevent the impurities in the substrate 10 or the electric field generated by the electric charges between the film layer interfaces from affecting channel regions of the first active layer 23, thereby improving reliability of the first thin-film transistor 20. Since the shielding layer 30 and the second active layer 41 are made of a same material and by a same process, the shielding layer 30 and the second active layer 41 can be formed in a same forming processing by a same mask plate. There is no need to make separate mask plates. Therefore, number of mask plates used in a method for forming the array substrate and a process cost can be reduced, and process steps can be simplified. Compared with a case where the shielding layer 30 and the second active layer 41 are disposed on different film layers, the shielding layer 30 and the second active layer 41 are disposed on a same layer in the embodiment. An overall thickness of a display panel is reduced. Further, the shield layer 30 is electrically connected to the first gate electrode 21 without separately providing a fixed potential for the shield layer 30, simplifying process steps.

Since the second active layer 41 is very thin, that is, the shielding layer 30 is very thin, after being covered by insulating layers including the first gate electrode insulating layer 22, an edge of the shielding layer 30 does not affect a film thicknesses of a first active layer 23 region corresponding to the edge of the shielding layer 30, thereby not affecting performance of the first thin-film transistor 20.

Figure 8:
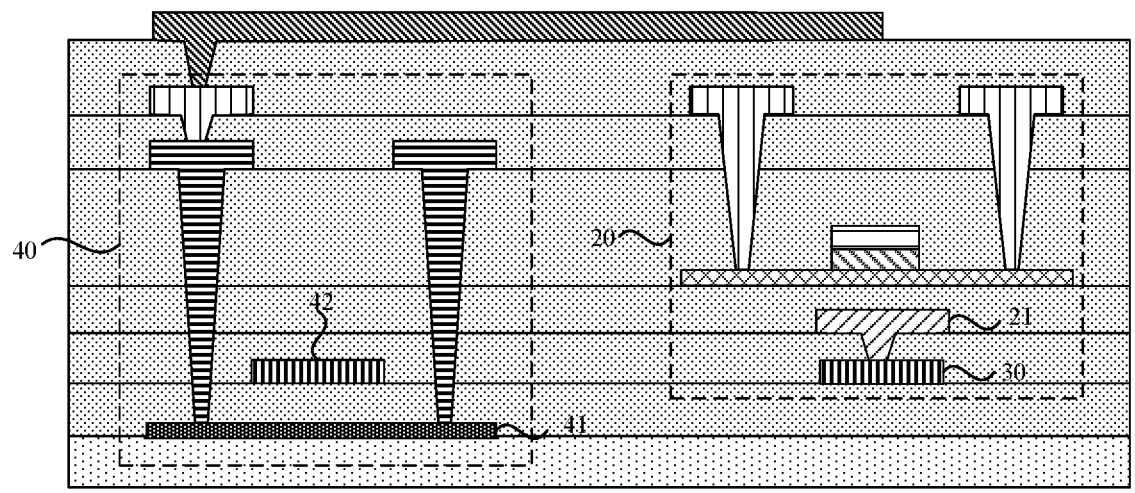
FIG. 8 illustrates a schematic diagram of another array substrate consistent with various disclosed embodiments of the present disclosure.

Optionally, FIG. 8 illustrates a schematic diagram of another array substrate consistent with various disclosed embodiments of the present disclosure. As shown in FIG. 8, The first thin-film transistor 20 further includes a shield layer 30. The shield layer 30 is on a side of the first gate electrode 21 facing away from the first gate electrode insulating layer 22. The second thin-film transistor 40 further includes a third gate electrode 42. The third gate electrode 42 is on a side of the first gate electrode 21 facing away from the first gate electrode insulating layer 22. The third gate electrode 42 and the shield layer 30 are made of a same material and by a same process. The shield layer 30 is electrically connected to the first gate electrode 21.

In one embodiment, the shielding layer 30 blocks impurities in the substrate 10 or an electric field generated by electric charges between the film layer interfaces on a side of the first gate electrode 21 close to the substrate 10, so as to prevent the impurities in the substrate 10 or the electric field generated by the electric charges between the film layer interfaces on the side of the first gate electrode 21 close to the substrate 10 from affecting channel regions of the first active layer 23, thereby improving reliability of the first thin-film transistor 20. Since the shielding layer 30 and the third active layer 42 can be made of a same material and by a same process, the shielding layer 30 and the third active layer 42 can be formed in a same forming processing by a same mask plate. There is no need to make separate mask plates. Therefore, number of mask plates used in a method for forming the array substrate and a process cost can be reduced, and process steps can be simplified. Compared with a case where the shielding layer 30 and the third active layer 42 are disposed on different film layers, the shielding layer 30 and the third active layer 42 are disposed on a same layer in the embodiment. An overall thickness of a display panel is reduced. Further, the shield layer 30 is electrically connected to the first gate electrode 21 without separately providing a fixed potential for the shield layer 30, simplifying process steps.

Since the third active layer 42 is very thin, that is, the shielding layer 30 is very thin, after being covered by insulating layers including the first gate electrode insulating layer 22, an edge of the shielding layer 30 does not affect a film thickness of a first active layer 23 region corresponding to the edge of the shielding layer 30, thereby not affecting performance of the first thin-film transistor 20.

Optionally, a structure of the second thin-film transistor 40 may be a top-gate structure or a bottom-gate structure. Exemplarily, referring to FIG. 7, when the structure of the second thin-film transistor 40 is a top gate structure, the third gate electrode 42 is between the second active layer 41 and the first gate electrode 21. When a structure of the second thin-film transistor 40 is a bottom gate structure, the third gate electrode 42 is on a side of the second active layer 41 facing away from the first gate electrode 21 (not shown).

Optionally, referring to FIG. 7, the second thin-film transistor 40 further includes a second source electrode 43 and a second drain electrode 44. The second source electrode 43 is between the first source electrode 25 of the first thin-film transistor 20 and the second gate electrode 27. The second drain electrode 44 is between the first drain electrode 26 of the first thin-film transistor 20 and the second gate electrode 27. Optionally, the second thin-film transistor 40 further includes a connection structure 45. Exemplarily, one end of the connection structure 45 is electrically connected to the second source 43 or the second drain 44 of the second thin-film transistor 40. The other end of the connection structure 45 is electrically connected to an anode 51 of a light emitting element. Optionally, the connection structure 45 and the first source electrode 25 and the first drain electrode 26 of the first thin-film transistor 20 are made of a same material and by a same process. Therefore, number of mask plates used in a method for forming the array substrate and a process cost can be reduced, and process steps can be simplified. The second source electrode 43 or the second drain electrode 44 of the second thin-film transistor 40 is electrically connected to an anode 310 of a light emitting element through the connection structure 45. Therefore, when the second source electrode 43 and the second drain electrode 44 of the second thin-film transistor 40 are electrically connected to the second active layer 41 by a through hole SS, due to a small etching depth and high accuracy of the through hole SS, damage to the second active layer 41 during etching can be reduced, and reliability of the second thin-film transistor 40 can be improved.

Figure 9:
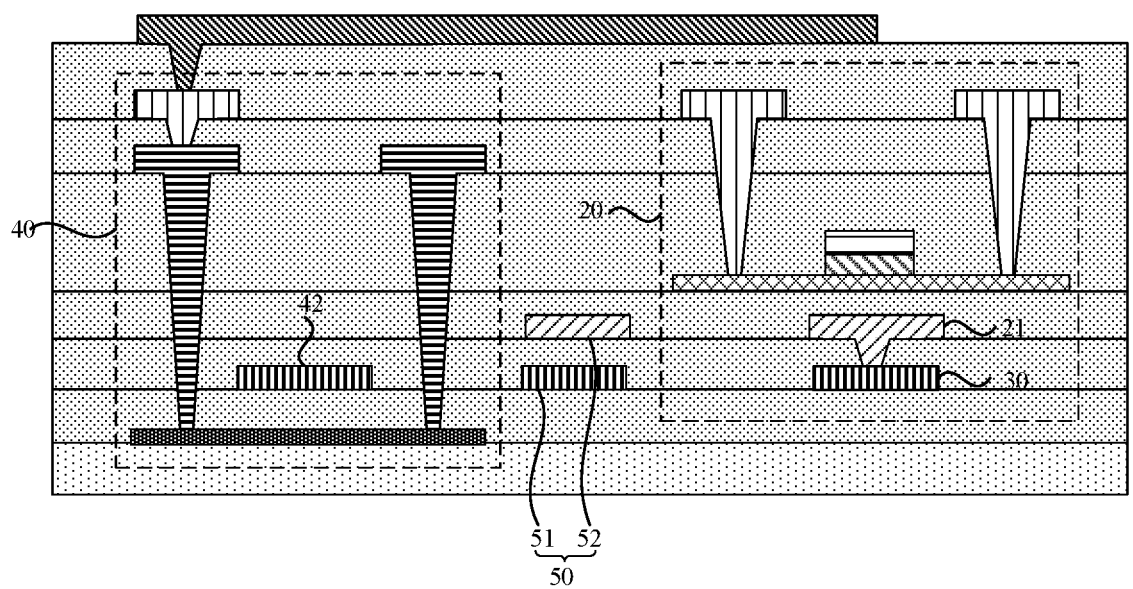
FIG. 9 illustrates a schematic diagram of another array substrate consistent with various disclosed embodiments of the present disclosure.

Optionally, FIG. 9 illustrates a schematic diagram of another array substrate consistent with various disclosed embodiments of the present disclosure. As shown in FIG. 9, the array substrate further includes at least one capacitor 50. The capacitor 50 includes a first electrode 51 and a second electrode 52. The third gate electrode 42 and the first electrode 51 are made of a same material and by a same process. The first gate electrode 21 and the second electrode 52 are made of a same material and by a same process.

Since the third gate electrode 42 and the first electrode 51 can be made by a same mask plate in a same forming process, and the first gate electrode 21 and the second electrode 52 can be made by a same mask plate in a same forming process, there is no need to make separate mask plates for the first electrode 51 and the second electrode 52. Therefore, number of mask plates used in a method for forming the array substrate and a process cost can be reduced, process steps can be simplified, and productivity can be increased. Compared with a case where the third gate electrode 42 and the first electrode 51, the first gate electrode 21 and the second electrode 52 are respectively disposed on different film layers, the shielding layer 30 and the second active layer 41 are disposed on a same layer in the embodiment. An overall thickness of a display panel is reduced. In one embodiment, the third gate electrode 42 and the first electrode 51 are disposed on a same layer, and the first gate electrode 21 and the second electrode 52 are disposed on a same layer, thereby reducing an overall thickness of a display panel.

In the above embodiments, positional relationships between each film layer of the second thin-film transistor 40 and each film layer of the capacitor 50 in the array substrate are only examples. Those skilled in the art can make adjustments according to actual conditions, which can be encompassed within the scope of the present disclosure. The positional relationships between each film layer of the second thin-film transistor 40 and each film layer of the capacitor 50 in the array substrate are not specifically limited herein.

The present disclosure also provides a display panel including an array substrate provided in any embodiment of the present disclosure. Since the display panel provided by the present disclosure includes any of the array substrates provided by the above embodiments, the display panel has same or corresponding technical effects as the array substrate provided by the above embodiments.

Optionally, the display panel provided by the present disclosure may be an organic light emitting diode display panel or a liquid crystal display panel.

Figure 10:
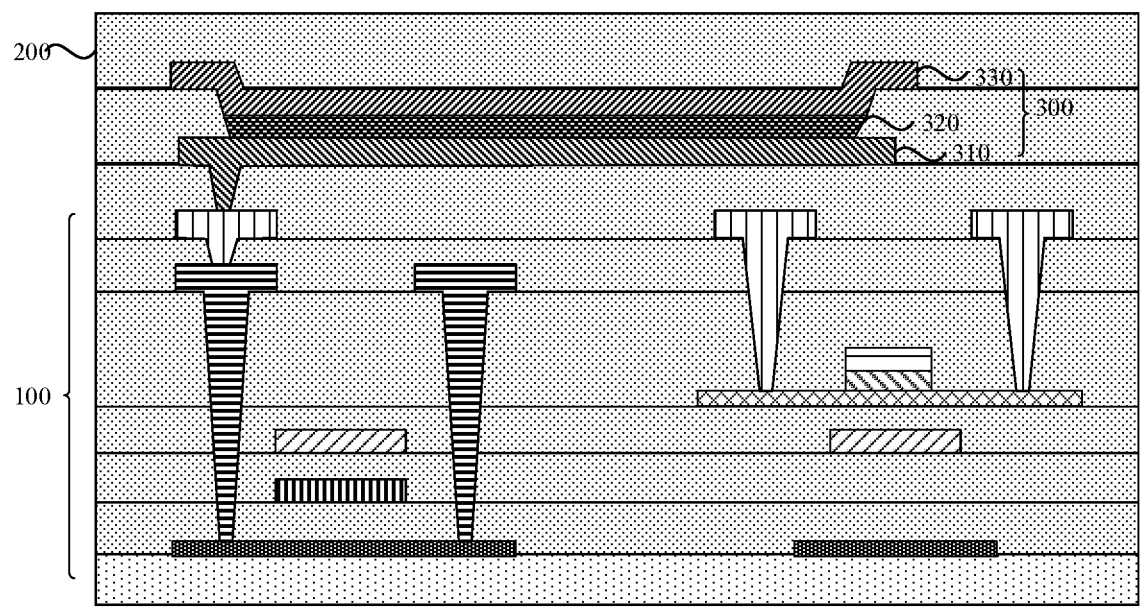
FIG. 10 illustrates a schematic diagram of a display panel consistent with various disclosed embodiments of the present disclosure.

Optionally, FIG. 10 illustrates a schematic diagram of another array substrate consistent with various disclosed embodiments of the present disclosure. As shown in FIG. 10, when the display panel provided by the present disclosure is an organic light-emitting diode display panel, the display panel further includes a counter substrate 200 disposed opposite to an array substrate 100 and a plurality of light-emitting elements 300 disposed between the array substrate 100 and the counter substrate 200. A pixel circuit is configured to drive the light emitting element 300 to emit light. Optionally, the light emitting element 300 may include an anode electrode 310, a light emitting material layer 320 and a cathode electrode 330 that are stacked. Optionally, the opposite substrate 200 may include a polarizer or a touch substrate. Optionally, the display panel may further include an encapsulation layer (not shown) between the light-emitting element 300 and the counter substrate 200 for protecting the light-emitting elements 300 from water and oxygen. Optionally, the encapsulation layer may be a glass encapsulation layer or a film encapsulation layer.

Figure 11:
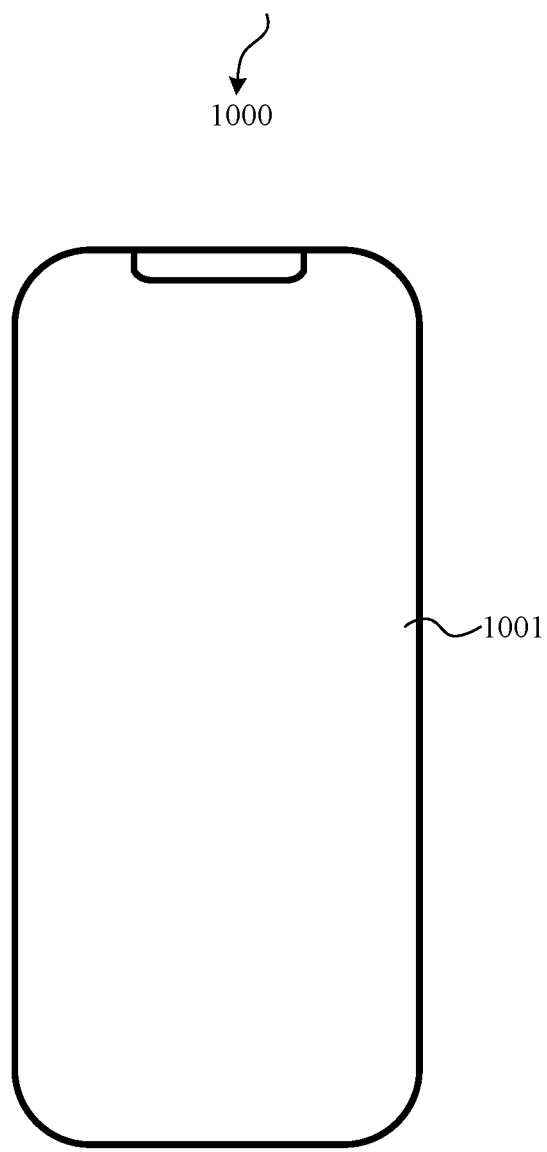
FIG. 11 illustrates a schematic diagram of a display device consistent with various disclosed embodiments of the present disclosure.

A display device including the display panel provided is provided in one embodiment. For example, FIG. 11 illustrates a schematic diagram of another array substrate consistent with various disclosed embodiments of the present disclosure. As shown in FIG. 11, a display device 1000 includes a display panel 1001 provided in any of the above embodiments. Exemplarily, the display device 1000 may be an electronic device such as a mobile phone, a computer, a smart wearable device (e.g. a smart watch), and a vehicle-mounted display device.

A method for forming an array substrate is provided in one embodiment. The method for forming the array substrate may be suitable for forming any array substrate provided by the present disclosure. The array substrate includes at least one first thin-film transistor. The first thin-film transistor includes a first gate electrode, a first gate electrode insulating layer, a first active layer, a second gate electrode insulating layer, a first source, a first drain electrode and a second gate electrode.

Figure 12:
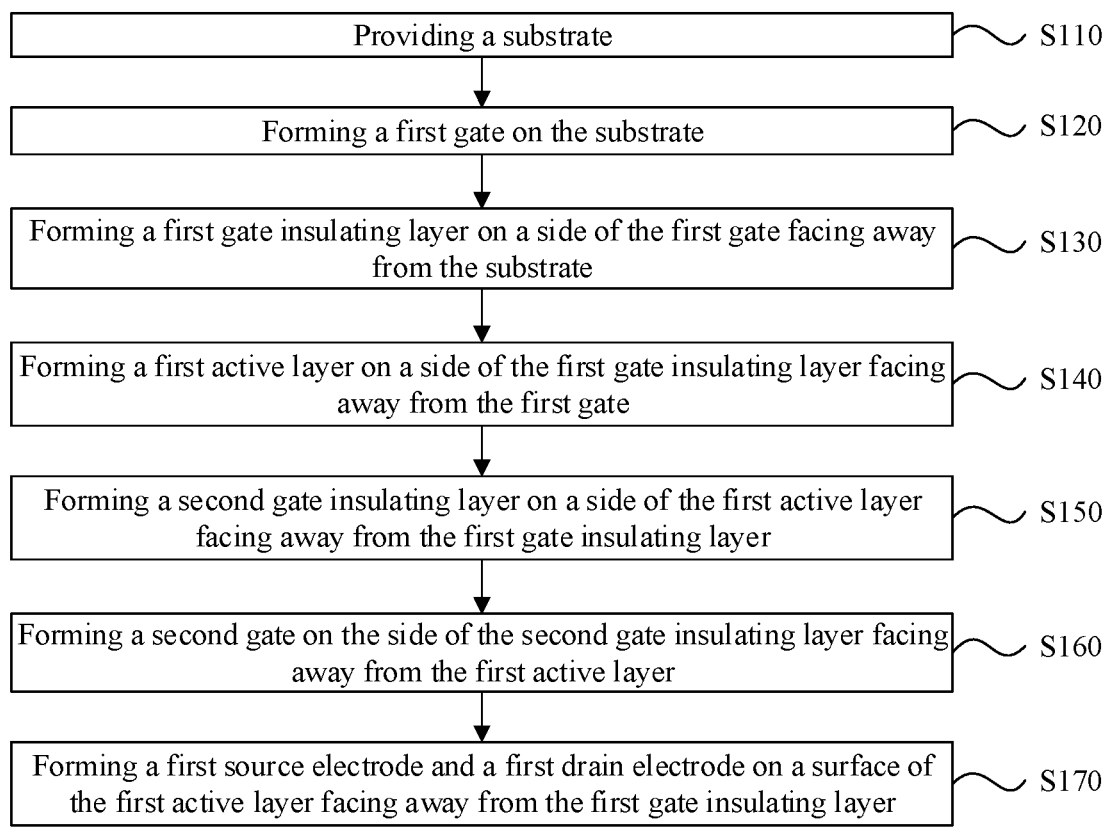
FIG. 12 illustrates a flow chart of a method for forming an array substrate consistent with various disclosed embodiments of the present disclosure.

FIG. 12 illustrates a flow chart of a method for forming an array substrate consistent with various disclosed embodiments of the present disclosure. As shown in FIG. 12, in one embodiment, the method for forming the array substrate includes the following steps.

S110: providing a substrate.

Figure 13:
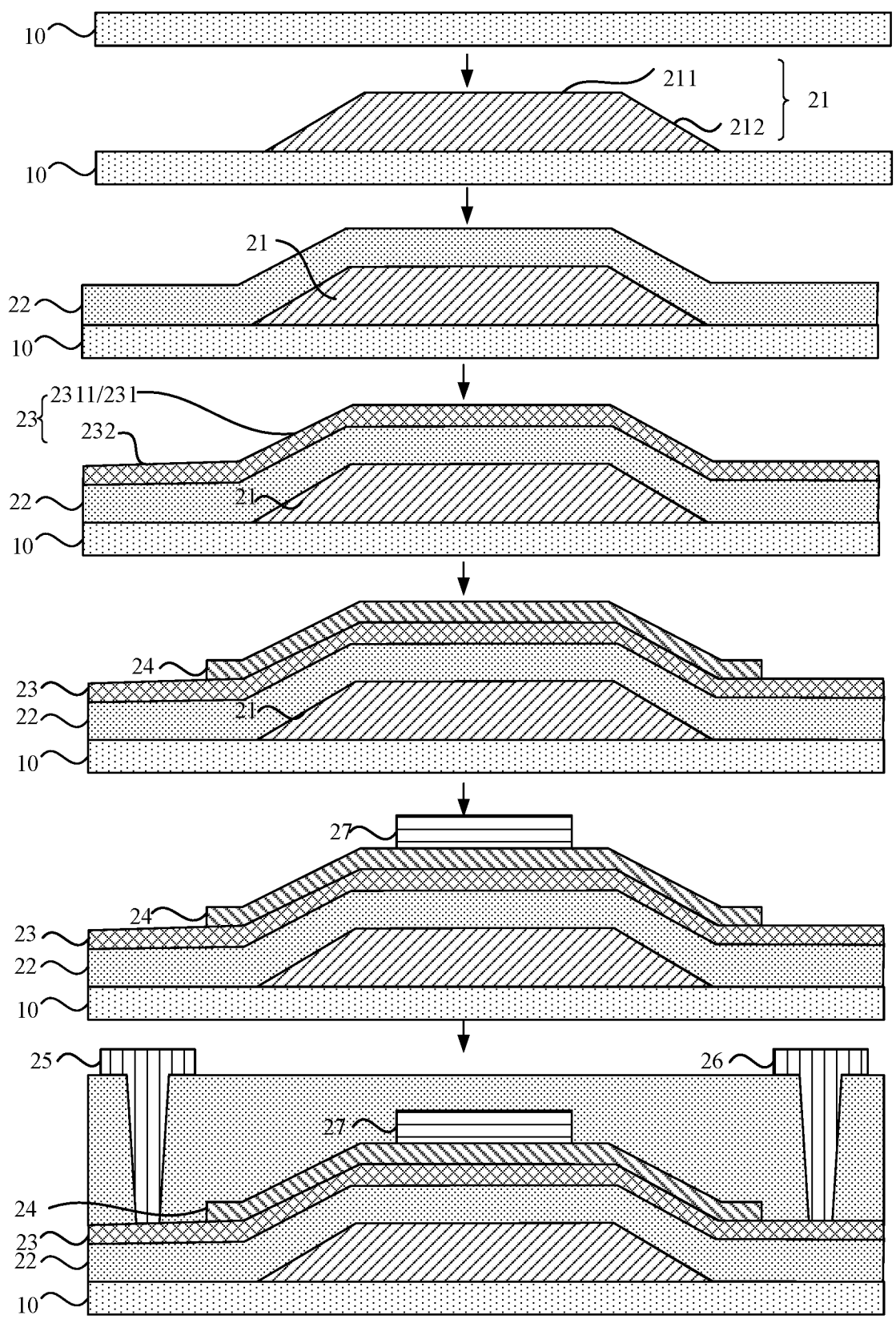
FIG. 13 illustrates a schematic diagram of a flow chart of a method for forming an array substrate consistent with various disclosed embodiments of the present disclosure.

Referring to FIG. 13, a substrate 10 supports and protects other film layers on the array substrate, and subsequently each film layer of the array substrate is formed on the substrate 10. The substrate 10 may be a rigid substrate or a flexible substrate. A material of the rigid substrate can be glass. A material of the flexible substrate can be polyimide. A thickness of the substrate 10 can be set according to process requirements and product requirements.

S120: forming a first gate electrode on the substrate.

Referring to FIG. 13, A first gate electrode 21 is formed on the substrate 10. The first gate electrode 21 includes a straight portion 211 and a slope portion 212, so that a film layer subsequently formed on the first gate electrode 21 has good coverage.

S130: forming a first gate electrode insulating layer on a side of the first gate electrode facing away from the substrate.

Referring to FIG. 13, a material of the first gate electrode insulating layer 22 may include silicon oxide or silicon nitride. The first gate electrode insulating layer 22 can prevent impurities such as metal ions in the first gate electrode 21 from diffusing into a subsequently formed first active layer 23. The first gate electrode insulating layer 22 can also prevent the first gate electrode 21 from oxidizing. Since the first gate electrode 21 includes a straight portion 211 and a slope portion 212, when the first gate electrode insulating layer 22 is formed, a slope can be formed in a region corresponding to the slope portion 212 of the first gate electrode 21.

S140: forming a first active layer on a side of the first gate electrode insulating layer facing away from the first gate electrode.

Referring to FIG. 13, the first active layer 23 includes a first region 231 and a second region 232 surrounding the first region 231. A vertical projection of the first gate electrode 21 on the substrate 10 is within a vertical projection of the first region 231 on the substrate 10. When the first gate electrode insulating layer 22 is formed, a slope is formed in a region corresponding to the slope portion 212 of the first gate electrode 21. Therefore, when a film is formed on the first active layer 23, the film is thin and loose at a position 2311 corresponding to the slope portion 212 of the first gate electrode 21. Optionally, a material of the first active layer 23 includes an indium gallium zinc oxide material. When the first active layer 23 of the first thin-film transistor 20 is an indium gallium zinc oxide semiconductor active layer, the first thin-film transistor 20 has advantages of high carrier mobility, low deposition temperature, high transparency and so on, thereby realizing low frequency driving.

S150: forming a second gate electrode insulating layer on a side of the first active layer facing away from the first gate electrode insulating layer.

A vertical projection of the first region 231 of the first active layer 23 on the substrate 10 is within a vertical projection of the second gate electrode insulating layer 24 on the substrate 10. The vertical projection of the second gate electrode insulating layer 24 on the substrate 10 is within a vertical projection of the first active layer 23 on the substrate 10. As the vertical projection of the first region 231 of the first active layer 23 on the substrate 10 is within the vertical projection of the second gate electrode insulating layer 24 on the substrate 10, the slope position 2311 of the first active layer 23 is covered by the second gate electrode insulating layer 24, thereby avoiding a problem that the slope position 2311 of the first active layer 23 is easily broken when the second gate electrode insulating layer 24 is formed by subsequent etching, and improving reliability of the first thin-film transistor 20. Optionally, a material of the second gate electrode insulating layer 24 may include silicon oxide or silicon nitride. The second gate electrode insulating layer 24 can improve adhesion of the first active layer 23.

S160: forming a second gate electrode on a side of the second gate electrode insulating layer facing away from the first active layer.

Referring to FIG. 13, a second gate electrode 27 is formed on a side of the second gate electrode insulating layer 24 facing away from the first active layer 23, that is, the first thin-film transistor is a double gate thin-film transistor, which improves mobility of the first active layer 23.

S170: forming a first source electrode and a first drain electrode on the first active layer facing away from the first gate electrode insulating layer.

In the technical solution, a vertical projection of the first gate electrode on the substrate is within a vertical projection of the first region of the first active layer on a substrate. The vertical projection of the first region of the first active layer on the substrate is within a vertical projection of the second gate electrode insulating layer on the substrate. A slope region of the first active layer corresponding to an edge of the first gate electrode is covered by the second gate electrode insulating layer, and the slope region of the first active layer is protected by the second gate electrode insulating layer. Therefore, when a film is formed on the first active layer, the film at a position of the slope can be prevented from being thin and loose, and when the second active layer is etched on a side of the first active layer facing away from the substrate, a problem that the slope region of the first active layer corresponding to the edge of the first gate electrode is easily broken can be prevented.

Figure 14:
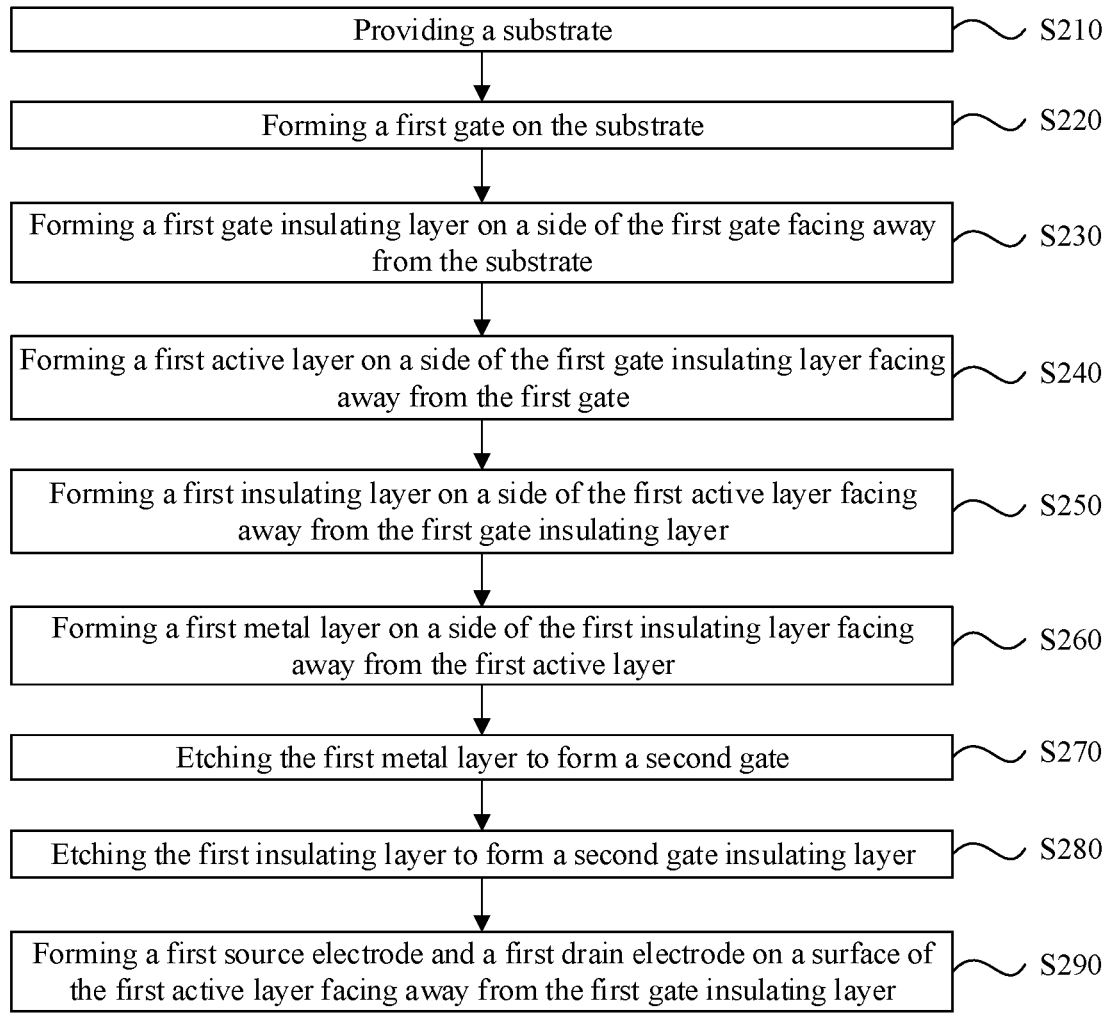
FIG. 14 illustrates a flow chart of another method for forming an array substrate consistent with various disclosed embodiments of the present disclosure.

FIG. 14 illustrates a flow chart of another method for forming an array substrate consistent with various disclosed embodiments of the present disclosure. As shown in FIG. 14, in one embodiment, the method for forming the array substrate includes the following steps.

S210: providing a substrate.

S220: forming a first gate electrode on the substrate.

S230: forming a first gate electrode insulating layer on a side of the first gate electrode facing away from the substrate.

S240: forming a first active layer on a side of the first gate electrode insulating layer facing away from the first gate electrode.

S250: forming a first insulating layer on a side of the first active layer facing away from the first gate electrode insulating layer.

Figure 15:
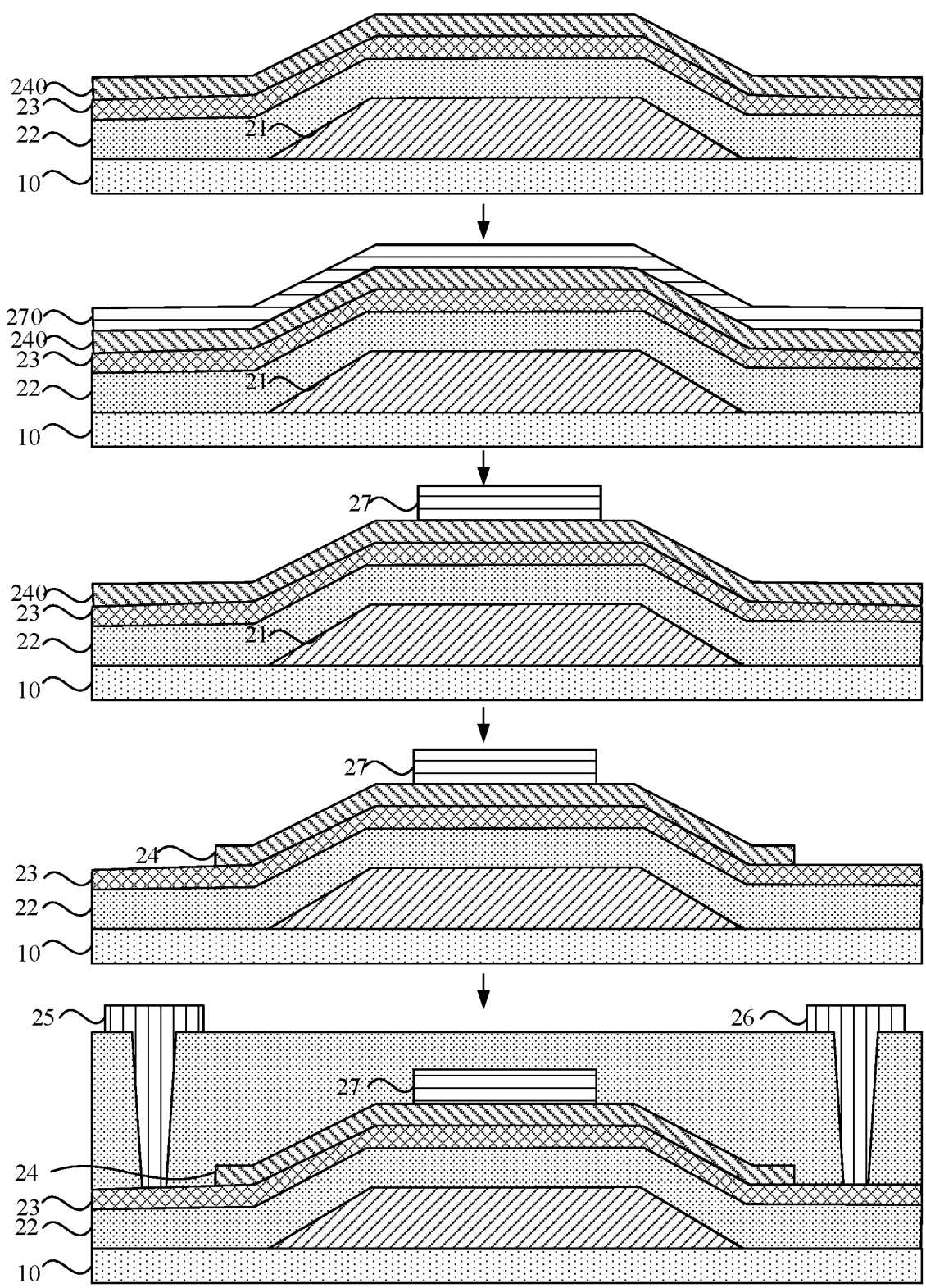
FIG. 15 illustrates a schematic diagram of a flow chart of another method for forming an array substrate consistent with various disclosed embodiments of the present disclosure.

Referring to FIG. 15, a whole first insulating layer 240 is formed on a side of the first active layer 23 facing away from the first gate electrode insulating layer 22.

Steps before forming the first insulating layer 240 are not shown in FIG. 15 since S210-S240 are the same as S110-S140 shown in FIG. 13.

S260: forming a first metal layer on a side of the first insulating layer facing away from the first active layer.

Referring to FIG. 15, an entire first metal layer 270 is formed on a side of the first insulating layer 240 facing away from the first active layer 23. In one embodiment, after the first insulating layer 240 is formed on a side of the first active layer 23 facing away from the first gate electrode insulating layer 22, a whole first metal layer 270 is formed on the side of the first insulating layer 240 facing away from the first active layer 23. That is, the first insulating layer 240 is formed first by a film forming process, and then the first metal layer 270 is formed. Compared with an existing forming method that, the first insulating layer 240 is formed first by a film forming process, then the second gate electrode insulating layer 24 is formed by an etching process, then the first metal layer 270 is formed by a film forming process, and then the second gate electrode 27 is formed by an etching process, the embodiment simplifies process steps and improves production efficiency.

S270: etching the first metal layer to form a second gate electrode.

The first thin-film transistor is a double gate thin-film transistor, which improves mobility of the first active layer 23.

S280: etching the first insulating layer to form a second gate electrode insulating layer.

Referring to FIG. 15, the second gate electrode 27 is formed first by an etching process, and then the second gate electrode insulating layer 24 is formed. Compared with an existing forming method that, the first insulating layer 240 is formed by a film forming process, then the second gate electrode insulating layer 24 is formed by an etching process, and then the first metal layer 270 is formed by a film forming process, and then the second gate electrode 27 is formed by an etching process, the embodiment simplifies process steps and improves production efficiency.

S290: forming a first source electrode and a first drain electrode on the first active layer facing away from the first gate electrode insulating layer.

A first insulating layer is first formed on a side of a first active layer facing away from a first gate electrode insulating layer, and then a first metal layer is formed on a side of the first insulating layer facing away from the first active layer, then a second gate electrode is formed by etching the first metal layer, and then a second gate electrode insulating layer is formed by etching the first insulating layer. The technical solution simplifies process steps and improves production efficiency.

Figure 16:
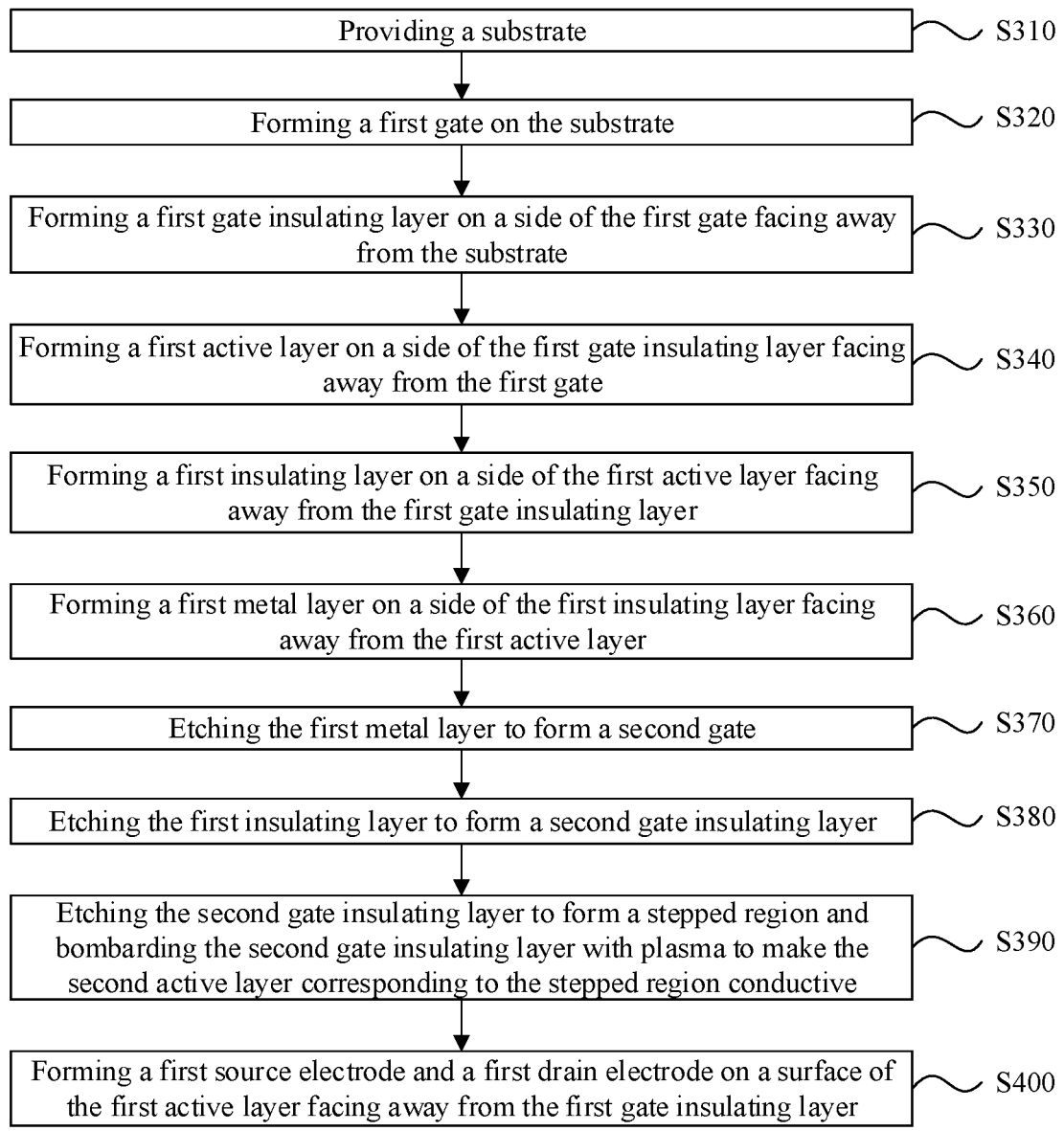
FIG. 16 illustrates a flow chart of another method for forming an array substrate consistent with various disclosed embodiments of the present disclosure.

FIG. 16 illustrates a flow chart of another method for forming an array substrate consistent with various disclosed embodiments of the present disclosure. As shown in FIG. 16, in one embodiment, the method for forming the array substrate includes the following steps.

S310: providing a substrate.

S320: forming a first gate electrode on the substrate.

S330: forming a first gate electrode insulating layer on a side of the first gate electrode facing away from the substrate.

S340: forming a first active layer on a side of the first gate electrode insulating layer facing away from the first gate electrode.

S350: forming a first insulating layer on a side of the first active layer facing away from the first gate electrode insulating layer.

S360: forming a first metal layer on a side of the first insulating layer facing away from the first active layer S370: etching the first metal layer to form a second gate electrode.

S380: etching the first insulating layer to form a second gate electrode insulating layer.

Figure 17:
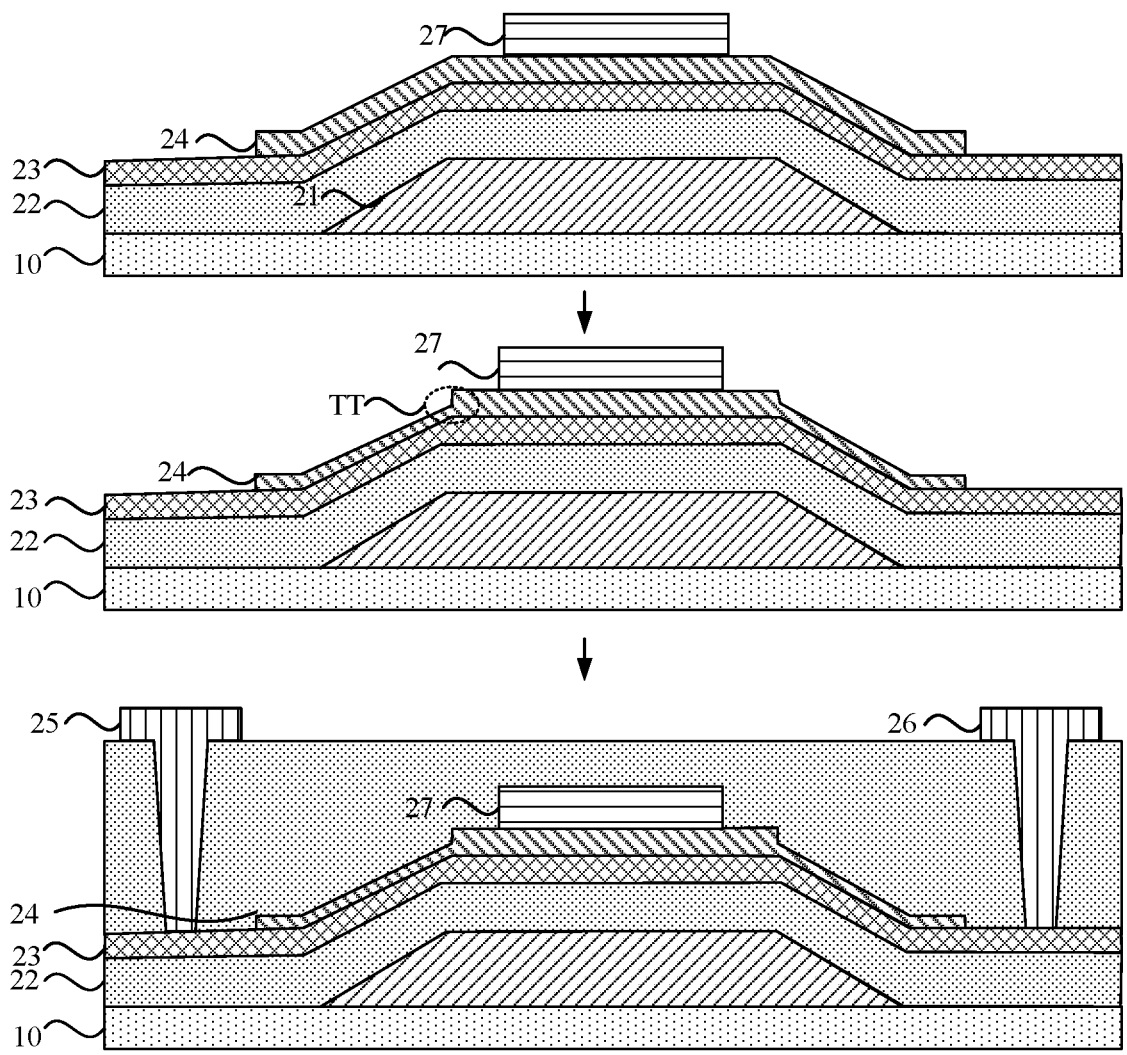
FIG. 17 illustrates a schematic diagram of a flow chart of another method for forming an array substrate consistent with various disclosed embodiments of the present disclosure.

Steps before forming the second gate electrode insulating layer 24 are not shown in FIG. 17 since S310-S340 are the same as S110-S140 shown in FIG. 13 and S350-S370 are the same as S250-S270 shown in FIG. 15.

S390: etching the second gate electrode insulating layer to form a stepped region and bombarding the second gate electrode insulating layer with plasma to form the second active layer corresponding to the stepped region conductive.

Referring to FIG. 17, in the process of forming the stepped region TT of the second gate electrode insulating layer 24, the second gate electrode insulating layer 24 is bombarded with plasma. On one hand, it is advantageous to conduct a conductive treatment of the first active layer 23 except channel regions. For example, when the first active layer 23 is an indium gallium zinc oxide semiconductor active layer, in a process of forming the stepped region TT by etching, a region of the first active layer 23 corresponding to the thinned second gate electrode insulating layer 24 becomes conductive by plasma bombardment. On the other hand, the subsequent film layer formed on the second gate electrode 27 has good coverage.

S400: forming a first source electrode and a first drain electrode on the first active layer facing away from the first gate electrode insulating layer.

Optionally, the array substrate further includes a second insulating layer between a third gate electrode and the second active layer, and other film layers known to those skilled in the art. Each film layer on a side of the array substrate can be formed by physical vapor deposition, chemical vapor deposition, inkjet printing, or other film forming methods known to those skilled in the art. A film forming method for each film layer can be set according to actual needs of a method for forming the array substrate, which is not limited herein.

The above are only preferred embodiments of the present disclosure and applied technical principles. The present disclosure is not limited to the specific embodiments described herein. Those skilled in the art can make various obvious changes, re-adjustments, and substitutions without departing from the protection scope of the present disclosure. Although the present disclosure has been described in detail through the above embodiments, the present disclosure is not only limited to the above embodiments and may include other equivalent embodiments without departing from concepts of the present disclosure. The scope of the present disclosure is determined by the scope of the appended claims.

What is claimed is:

1. An array substrate, comprising:
a substrate and at least one first thin-film transistor on the substrate, wherein a first thin-film transistor of the at least one first thin-film transistor includes:
a first gate electrode,
a first gate electrode insulating layer on a side of the first gate electrode facing away from the substrate,
a first active layer on a side of the first gate electrode insulating layer facing away from the first gate electrode,
a second gate electrode insulating layer on a side of the first active layer facing away from the first gate electrode insulating layer,
a second gate electrode on a side of the second gate electrode insulating layer facing away from the first active layer, and
a first source electrode and a first drain electrode on the first active layer facing away from the first gate electrode insulating layer, wherein:
the first active layer includes a first region and a second region surrounding the first region,
a vertical projection of the first gate electrode on the substrate is smaller than and completely within a vertical projection of the first region on the substrate,
the vertical projection of the first region on the substrate is smaller than and completely within a vertical projection of the second gate electrode insulating layer on the substrate, and
the vertical projection of the second gate electrode insulating layer on the substrate is smaller than and completely within a vertical projection of the first active layer on the substrate.

2. The array substrate according to claim 1, wherein a vertical projection of the second gate electrode on the substrate is within a vertical projection of the first gate electrode on the substrate.

3. The array substrate according to claim 2, wherein the second gate electrode insulating layer includes:
a stepped region, wherein a vertical projection of the stepped region on a plane of the substrate is non-overlapped with a vertical projection of the second gate electrode on the plane of the substrate.

4. The array substrate according to claim 3, wherein, in a direction perpendicular to the substrate, a thickness of the stepped region is H1, where 500 nm<H1<700 nm.

5. The array substrate according to claim 1, wherein the vertical projection of the first gate electrode on the substrate is within a vertical projection of the second gate electrode on the substrate.

6. The array substrate according to claim 5, wherein the first thin-film transistor further includes:
a shielding layer, wherein:
the shielding layer is on a side of the first gate electrode facing away from the first gate electrode insulating layer; and
the vertical projection of the second gate electrode on the substrate is within a vertical projection of the shielding layer on the substrate.

7. The array substrate according to claim 1, wherein a material of the first active layer includes indium gallium zinc oxide material.

8. The array substrate according to claim 7, further comprising:
at least one second thin-film transistor, wherein:
a second thin-film transistor of the at least one second thin-film transistor includes a second active layer;
the second active layer is on a side of the first gate electrode facing away from the first gate electrode insulating layer; and
a material of the second active layer includes a low-temperature polysilicon material.

9. The array substrate according to claim 8, wherein the first thin-film transistor further includes:
a shielding layer, wherein:
the shielding layer is on the side of the first gate electrode facing away from the first gate electrode insulating layer;
the second active layer and the shielding layer are made of a same material and by a same process; and
the shielding layer is electrically connected to the first gate electrode.

10. The array substrate according to claim 8, wherein the first thin-film transistor further includes:
a shielding layer, wherein:
the shielding layer is on the side of the first gate electrode facing away from the first gate electrode insulating layer;
the second thin-film transistor further includes a third gate electrode on the side of the first gate electrode facing away from the first gate electrode insulating layer;
the third gate electrode and the shielding layer are made of a same material and by a same process; and
the shielding layer is electrically connected to the first gate electrode.

11. The array substrate according to claim 10, further comprising:
at least one capacitor each including a first electrode and a second electrode, wherein:
the third gate electrode and the first electrode are made of a same material and by a same process; and
the first gate electrode and the second electrode are made of a same material and by a same process.

12. A display panel, comprising:
an array substrate, including:
a substrate and at least one first thin-film transistor on the substrate, wherein a first thin-film transistor of the at least one first thin-film transistor includes:
a first gate electrode,
a first gate electrode insulating layer on a side of the first gate electrode facing away from the substrate,
a first active layer on a side of the first gate electrode insulating layer facing away from the first gate electrode,
a second gate electrode insulating layer on a side of the first active layer facing away from the first gate electrode insulating layer,
a second gate electrode on a side of the second gate electrode insulating layer facing away from the first active layer, and
a first source electrode and a first drain electrode on the first active layer facing away from the first gate electrode insulating layer, wherein:
the first active layer includes a first region and a second region surrounding the first region, a vertical projection of the first gate electrode on the substrate is smaller than and completely within a vertical projection of the first region on the substrate, the vertical projection of the first region on the substrate is smaller than and completely within a vertical projection of the second gate electrode insulating layer on the substrate, and the vertical projection of the second gate electrode insulating layer on the substrate is smaller than and completely within a vertical projection of the first active layer on the substrate.

13. A display device, comprising the display panel according to claim 12.

14. A method for forming an array substrate, wherein the array substrate includes at least one first thin-film transistor, and a first thin-film transistor of the at least one first thin-film transistor includes a first gate electrode, a first gate electrode insulating layer, a first active layer, a second gate electrode insulating layer, a first source electrode, a first drain electrode, and a second gate electrode, the method comprising:

providing a substrate;

forming a first gate electrode on the substrate;

forming a first gate electrode insulating layer on a side of the first gate electrode facing away from the substrate;

forming a first active layer on a side of the first gate electrode insulating layer facing away from the first gate electrode;

forming a second gate electrode insulating layer on a side of the first active layer facing away from the first gate electrode insulating layer;

forming a second gate electrode on a side of the second gate electrode insulating layer facing away from the first active layer; and forming a first source electrode and a first drain electrode on the first active layer facing away from the first gate electrode insulating layer, wherein:

the first active layer includes a first region and a second region surrounding the first region, a vertical projection of the first gate electrode on the substrate is smaller than and completely within a vertical projection of the first region on the substrate, the vertical projection of the first region on the substrate is smaller than and completely within a vertical projection of the second gate electrode insulating layer on the substrate, and the vertical projection of the second gate electrode insulating layer on the substrate is smaller than and completely within a vertical projection of the first active layer on the substrate.

15. The method according to claim 14, wherein forming the second gate electrode insulating layer on the side of the first active layer facing away from the first gate electrode insulating layer, further comprises:

forming a first insulating layer on a side of the first active layer facing away from the first gate electrode insulating layer;

forming a second gate electrode on a side of the second gate electrode insulating layer facing away from the first active layer, comprising:

forming a first metal layer on a side of the first insulating layer facing away from the first active layer, etching the first metal layer to form a second gate electrode after forming the first metal layer on the side of the first insulating layer facing away from the first active layer; and etching the first insulating layer to form a second gate electrode insulating layer after etching the first metal layer to form the second gate electrode.

16. The method according to claim 15, after etching the first insulating layer to form the second gate electrode insulating layer, further comprising:

etching the second gate electrode insulating layer to form a stepped region, a vertical projection of the stepped region on a plane of the substrate non-overlapping with a vertical projection of the second gate electrode on the plane of the substrate; and when etching the second gate electrode insulating layer to form the stepped region, bombarding the second gate electrode insulating layer with plasma to form the second active layer corresponding to the stepped region conductive.

* * * * *